United States Patent
Moll

(10) Patent No.: US 7,610,520 B2
(45) Date of Patent: Oct. 27, 2009

(54) DIGITAL DATA SIGNAL TESTING USING ARBITRARY TEST SIGNAL

(75) Inventor: Joachim Moll, Herrenberg (DE)

(73) Assignee: Agilent Technologies, Inc., Santa Clara, CA (US)

( * ) Notice: Subject to any disclaimer, the term of this patent is extended or adjusted under 35 U.S.C. 154(b) by 669 days.

(21) Appl. No.: 11/349,378

(22) Filed: Feb. 6, 2006

(65) Prior Publication Data
US 2007/0185668 A1      Aug. 9, 2007

(51) Int. Cl.
*G06F 11/00* (2006.01)
*G01R 31/28* (2006.01)

(52) U.S. Cl. .................. 714/704; 714/724; 714/798; 714/799

(58) Field of Classification Search ............... 714/704, 714/724, 798, 799
See application file for complete search history.

(56) References Cited

U.S. PATENT DOCUMENTS

| | | | | |
|---|---|---|---|---|
| 6,041,090 | A * | 3/2000 | Chen | 375/376 |
| 6,430,715 | B1 * | 8/2002 | Myers et al. | 714/704 |
| 6,463,109 | B1 * | 10/2002 | McCormack et al. | 375/355 |
| 6,654,916 | B1 * | 11/2003 | Furukawa | 714/724 |
| 7,389,450 | B2 * | 6/2008 | Fleischer-Reumann et al. | 714/704 |
| 2004/0022337 | A1 * | 2/2004 | Moll | 375/355 |
| 2007/0063880 | A1 * | 3/2007 | Goller et al. | 341/100 |

FOREIGN PATENT DOCUMENTS

| | | |
|---|---|---|
| EP | 1191735 A1 * | 3/2002 |
| EP | 1 241 483 | 9/2002 |
| EP | 1 298 830 | 4/2003 |
| EP | 1 385 014 | 1/2004 |
| EP | 1 426 779 | 6/2004 |
| JP | 2001144819 | 5/2001 |
| WO | WO 2005/015251 | 2/2005 |

OTHER PUBLICATIONS

International Search Report dated Jul. 4, 2004.

\* cited by examiner

*Primary Examiner*—John J Tabone, Jr.
(74) *Attorney, Agent, or Firm*—Daniel Barth

(57) ABSTRACT

For testing a digital data signal, a value derived from the digital data signal at a sampling point is compared against a corresponding value of an arbitrary test signal. The comparison is interpreted as an error in case the derived value does not substantially match with the corresponding value of the arbitrary test signal.

17 Claims, 5 Drawing Sheets

DIGITAL DATA SIGNAL TESTING USING ARBITRARY TEST SIGNAL

CROSS-REFERENCE TO RELATED APPLICATIONS

This application is the National Stage of International Application No. PCT/EP2003/050365, filed on Aug. 6, 2003.

BACKGROUND OF THE INVENTION

The present invention relates to digital data signal testing.

Characterizing the transient behavior of digital signals, i.e. the transition from logical zero to logical one, and vice versa, has become increasingly important for designing as well as manufacturing such digital circuits. For testing a device under test (DUT), usually one or multiple stimulus signals are applied to the DUT and one or multiple response signals onto the stimulus signals are detected and analyzed (e.g. by comparing the detected response signal with an expected response signal).

A standard characterization of digital circuits requires determining the so-called Bit Error Rate (BER), i.e. the ratio of erroneous digital signals (Bits) to the total number of regarded digital signals. Bit Error Rate Testers (BERTs), such as the Agilent® 81250 ParBERT Platform with Agilent® E4875A User Software and Measurement Software both by the applicant Agilent Technologies, are provided to determine a so-called BER eye diagram as a two-dimensional graphical representation generated using a sweep over delay and threshold of an analyzer. The result is an eye pattern with a BER value dependent on the sampling point for a plurality of sampling points.

Each sampling point is determined by an absolute or relative time (e.g. with respect to corresponding transition of a clock signal—usually the system clock for generating the stimulus signals or a clock signal derived therefrom or from the response signal) and a threshold value for comparing the response signal with. The BER eye diagram gives information which BER value can be expected depending on the position of the sampling point within the eye. Parameters like jitter, level noise, phase margin, and quality factor (Q-factor) can be calculated from the BER eye diagram.

EP-A-1241483, pending European Patent Applications Nos. 02017334.0 and 02017333.2, and pending International Patent Application No. PCT/EP/0350307, all by the same applicant, disclose various aspects of BER testing, the teaching thereof shall be incorporated herein be reference.

SUMMARY OF THE INVENTION

It is an object of the invention to provide testing of digital data signals. The object is solved by the independent claim(s). Preferred embodiments are shown by the dependent claim(s).

The invention can be partly or entirely embodied or supported by one or more suitable software programs, which can be stored on or otherwise provided by any kind of data carrier, and which might be executed in or by any suitable data processing unit. Software programs or routines are preferably applied to control the measurement sequence and to compute the eye diagram or certain parameters thereof, e.g. rise time, fall time, signal levels, jitter.

BRIEF DESCRIPTION OF THE DRAWINGS

Other objects and many of the attendant advantages of the present invention will be readily appreciated and become better understood by reference to the following detailed description when considering in connection with the accompanied drawing(s). Features that are substantially or functionally equal or similar will be referred to with the same reference sign(s).

MORE DETAILED DESCRIPTION OF PREFERRED EMBODIMENTS ACCORDING TO THE INVENTION

Figure 1:
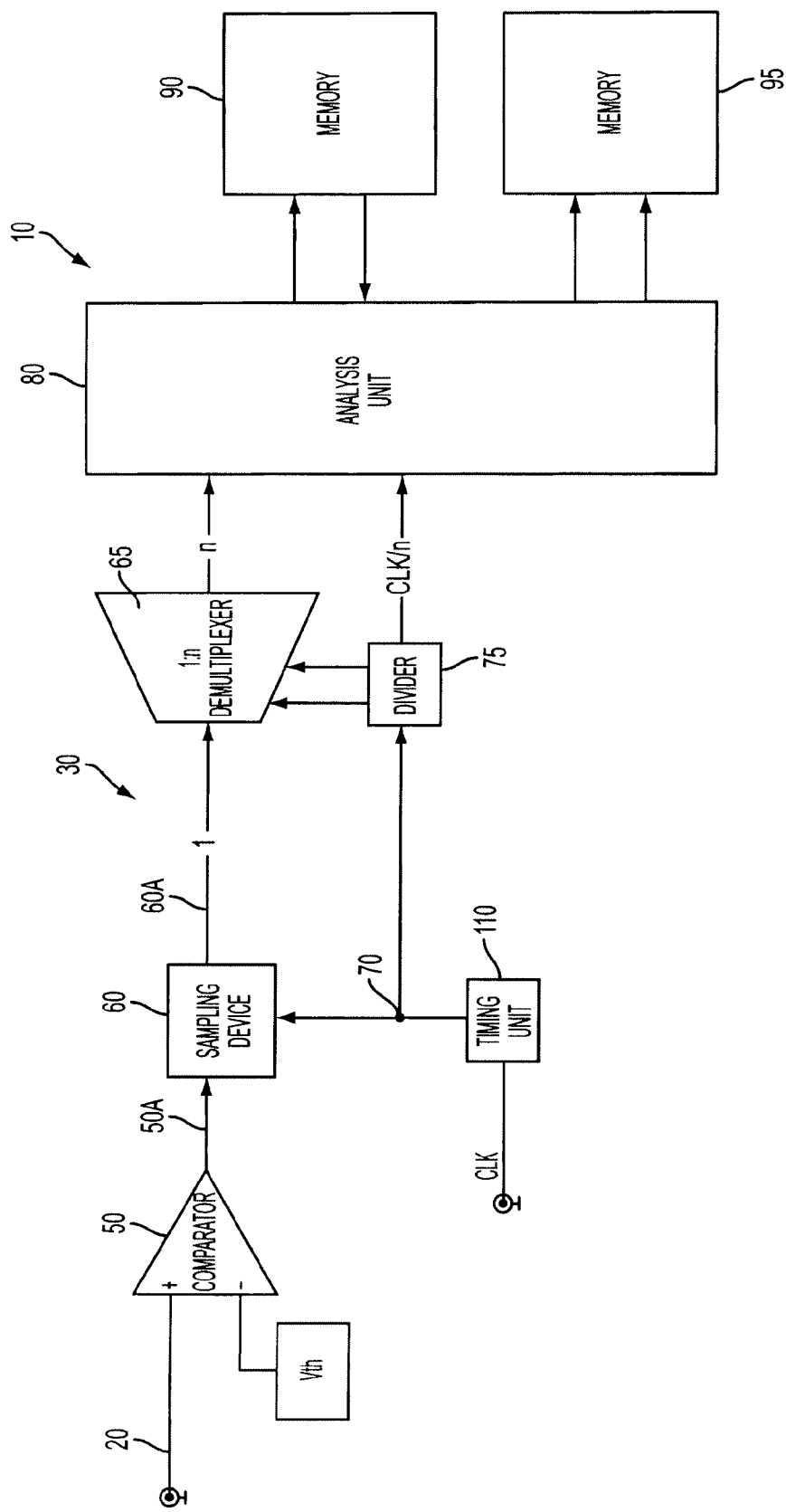
FIG. 1 shows a signal-analyzing unit for analyzing a digital test signal according to an example of the present invention.

In FIG. 1, a signal-analyzing unit 10 for analyzing a digital test signal 20 (as provided e.g. from a DUT) comprises a sampling path 30 receiving the test signal 20, and an analysis unit 80 adapted for receiving and jointly analyzing the output of the sampling 30.

The sampling path 30 comprises a comparator 50 for comparing the test signal 20 against a threshold value Vth and providing a comparison signal 50A as result of the comparison. The comparator 50 provides as the comparison signal 50A a first value (preferably a HIGH signal) in case the test signal is greater than the threshold value and a second value (preferably a LOW signal) in case the test signal is smaller than the threshold value.

A sampling device 60 receives as input the comparison signal 50A together with a timing signal 70 comprising a plurality of successive timing marks. The sampling device 60 is adapted to derive a value of the comparison signal for one or more (and preferably each) of the timing marks. The sampling device 60 provides as an output a sampling signal 60A representing the derived value(s) of the comparison signal 50A over the respective timing mark(s).

The sampling signal 60A is then subject (directly or after further processing) to further analysis by an analysis unit 80 for comparing the sampling signal 60A with an arbitrary test signal, which might be stored in a memory 90. Further, the analysis unit 80 might store the sampling signal 60A (e.g. for later analysis) in a separate memory 95 (but maybe also in the memory 90).

Optionally, a demultiplexer 65 and a divider 75 might be coupled before the inputs of the analysis unit 80 in order to decrease the data rate of the received signal. Often the BER-logic is implemented in lower speed digital circuits, e.g. FPGAs, and thus the high-speed data stream is broken up into several lower speed signals. This procedure is called demultiplexing or deserializing and is done with the demultiplexer 65. The divider 75 controls the demultiplexer 65 and delivers a lower speed clock to the analysis unit 80.

In the example of FIG. 1, the timing signal 70 is derived from a clock signal CLK. One or more appropriate timing units might be provided for generating the respective timing signal(s) comprising the timing marks from the clock signal CLK. In the example here, a timing unit 110 generates the timing signals from the clock signal CLK, which might be derived e.g. from internal clock signal, an external clock signal, from the test signal 20 (e.g. using clock data recovery schemes as well known in the art). The timing unit 110 derives the timing marks from transitions in its received clock signal (preferably from either one of a rising or falling edges), and might further allow modifying the timing marks with respect to corresponding transitions in its received clock signal by controllably delaying the timing marks with respect to corresponding transitions.

The analysis unit 80 receives the sampling signal 60A as well as the timing signal 70. The analysis unit 80 provides a joint analysis of the sampling signal 60A, thereby using knowledge about the timing signal 70 together with the threshold value Vth.

Varying the threshold value Vth allows the sampling device 60 to sample at each possible threshold value. Varying the relative (e.g. delay) time of the timing marks with respect to corresponding transitions of the clock signal CLK then allows to further analyze the test signal 20 along its time axes. Thus e.g. an eye diagram of the test signal 20 can be determined.

Accordingly, each value sampled corresponds with a sampling point represented by a threshold value Vth, and a timing point in the digital data signal 20. For single-ended signals, the threshold value Vth is typically related with respect to a voltage level of the digital data signal 20. For differential signals, the threshold value Vth may be related with respect to a difference signal as the difference between a normal signal of the digital data signal 20 and a complementary signal of the digital data signal 20, with the complementary signal being complementary to the normal signal. In that case, the comparator 50 compares the normal signal against the complementary signal of the digital data signal 20 received at its inputs.

The timing point can be a relative timing point and might be related a fixed value of a period, but is preferably related to a current value of the period in order to cover variations of the period of the digital data signal 20.

Insofar, the embodiment of FIG. 1 substantially represents a standard Bit Error Rate Tester (BERT) as well known in art and disclosed in the aforementioned documents. In those prior art BERTs, however, the value of bit error rate (BER) is usually determined by comparing the sampling signal 60A against an expected signal representing the test signal 20 expected to be free of errors. In contrast thereto, the analysis unit 80 according to the present invention compares the sampling signal 60A against an arbitrary test signal, and might determine therefrom a value of BER or derive further analysis therefrom. The analysis unit 80 interprets the comparison with the arbitrary test signal as an error in case the value of the sampling signal 60A does not substantially match with the corresponding value of the arbitrary test signal.

Such arbitrary test signal can be any kind of signal being independent of and/or non-correlated to the digital data signal 20, being unrelated to data content of the digital data signal 20, or having otherwise no deterministic relationship with the digital data signal 20. The arbitrary test signal can be an arbitrary test value, e.g. a fixed logic value (such as a logic HIGH or LOW signal or any other logic level) in the simplest case. The arbitrary test signal might also be a more complex signal such as a pseudo random binary sequence (PRBS), any kind of alternating signal such as a signal of alternating logic values (e.g. alternating between a logic HIGH and a logic LOW signal).

For the sake of simplicity, the following description shall be based on a fixed logic value as the arbitrary test signal, so that the analysis unit 80 compares the sampling signal 60A against one logic value (HIGH or LOW). However, it goes without saying that the inventive comparing analysis can be provided as well with other and more complex arbitrary test signals. In an example of a signal of alternating logic values as the arbitrary test signal, the analysis can e.g. be executed individually for each value of the alternating logic values.

In the example here, the arbitrary test signal shall be a fixed logic LOW, so that the sampling signal 60A always compares the sampling signal 60A against the logic LOW. The analysis unit 80 thus interprets any deviation of the sampling signal 60A from the logic LOW as an error.

For each sampling point, the analysis unit 80 can then determine a value of BER representing the ratio of errors detected by comparing against the arbitrary test signal per number of bits. It is noted that the thus determined BER value is different from different BER values determined by comparing against an expected error-free signal, since in latter case the content of the digital data signal 20 is considered into the analysis while in the former case (of the present invention) the arbitrary test signal is completely unrelated to the content of the digital data signal 20. For the sake of better distinguishing those BER values, the BER values determined by comparing against the arbitrary test signal shall be denoted in the following as Arbitrary Bit Error Rate (ABER).

For determining the values of ABER, the analysis unit 80 counts in a sequence of the digital data signal 20 two of: the number of bits in the sequence, the number of errors detected in the sequence, and the number of error-free bits in the sequence as the bits where no error is detected. The details of determining the values of ABER correspond to the determining of BER, which are well known in the art and need not be repeated herein.

Figure 2:
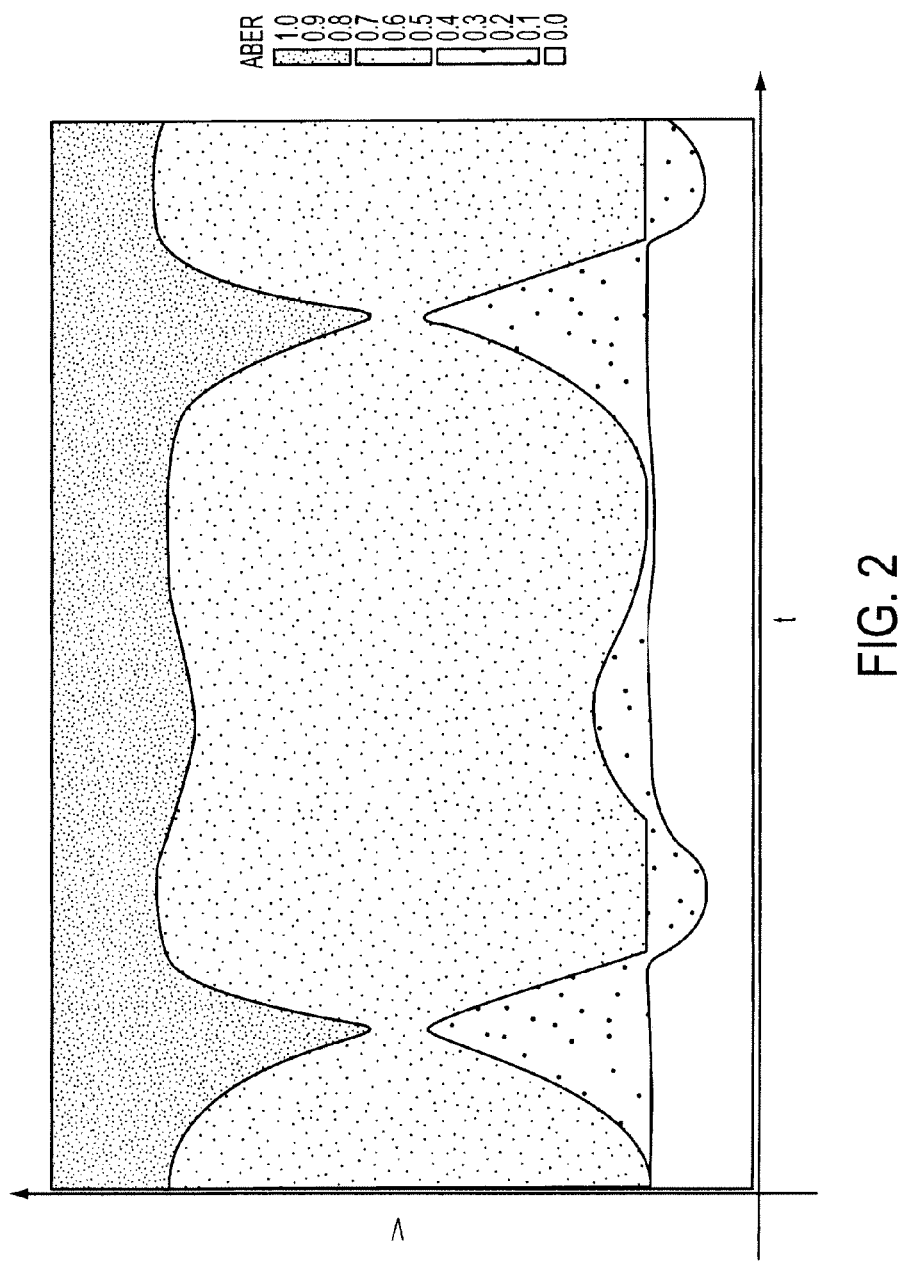
FIG. 2 shows an example of ABER values determined for a plurality of sampling points.

FIG. 2 shows an example of ABER values determined for each one of a plurality of sampling points, each sampling point being determined by a respective value t of a relative time scale and a respective value V of a voltage scale. The different values of ABER are represented using a gray scaling. Though the inventive scheme for determining ABER is entirely different from the determining BER with conventional Bit Error Rate Testers, it will be appreciated that the representation as in FIG. 2 of the ABER eye-diagram resembles a conventional BER eye-diagram.

The analysis unit 80 can further analyze the determined ABER values in order to derive an indication of occurrences of the digital data signal 20 at a respective sampling point. Such analysis, however, might also be provided by a different (e.g. external unit) coupled to the analysis unit 80 The analysis is preferably done by differentiating a course of the determined ABER values e.g. over the threshold values. Such indication can be the number of occurrences, a distribution of occurrences, or a probability of occurrences.

Figure 3A:
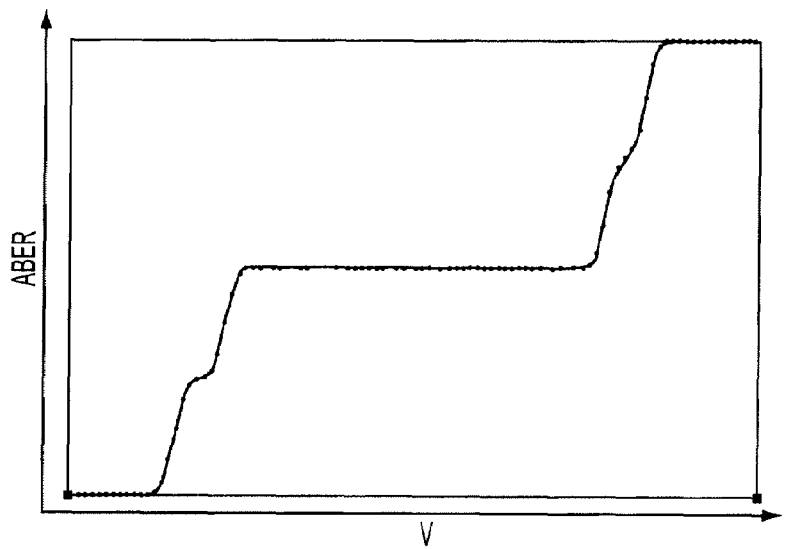
FIG. 3A shows an example of the course of the determined ABER values at a fixed value tx of the relative time scale over the threshold values V.

FIG. 3A shows an example showing the course of the determined ABER values at a fixed value tx of the relative time scale over the threshold values V. In the example of FIG. 3A, the fixed value tx shall be about in the middle of the time axis as in FIG. 2.

Figure 3B:
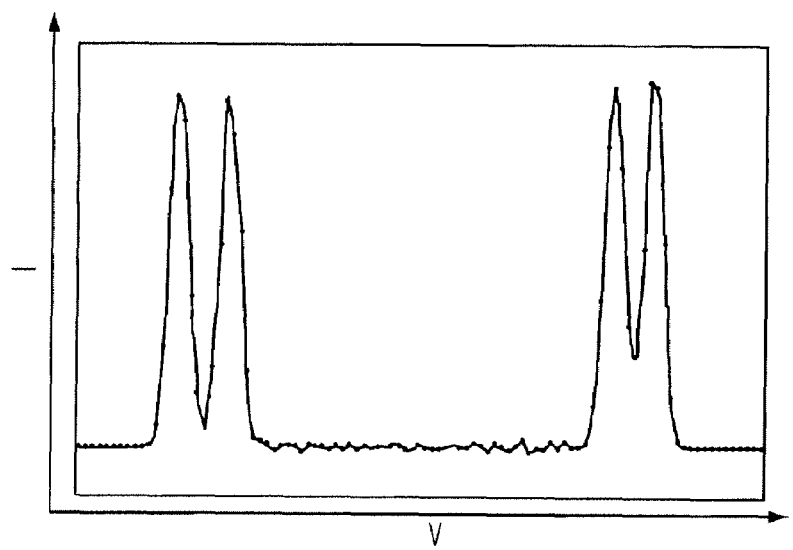
FIG. 3B shows an example, wherein the course of the determined ABER values at the fixed value tx as in FIG. 3A is differentiated over the threshold values V.

FIG. 3B shows an example, wherein the course of the determined ABER values at the fixed value tx as in FIG. 3A is differentiated over the threshold values V. The y-axis depicts an indication of occurrences of the digital data signal 20 at a respective sampling point (each represented by the value tx and the respective threshold value V of the x-axis). In the example of FIG. 3B, the indication of occurrences shall be the number of occurrences.

The analysis unit 80 might further process the received or determined information for graphically representing the derived indications of occurrences for different sampling points. Such processing, however, might also be provided by a different (e.g. external unit) coupled to the analysis unit 80. The graphical representation can be, for example, an absolute or relative distribution of derived indications relative to the respective sampling points (e.g. timing points and threshold values or voltages of signal level), e.g. in an eye diagram. While the representation can show the respective values of the indications as determined, comprehension of the representation might be improved by dividing the values into ranges of values and assigning a specific type of representation (e.g. color and/or shading) to each range of values.

Figure 4:
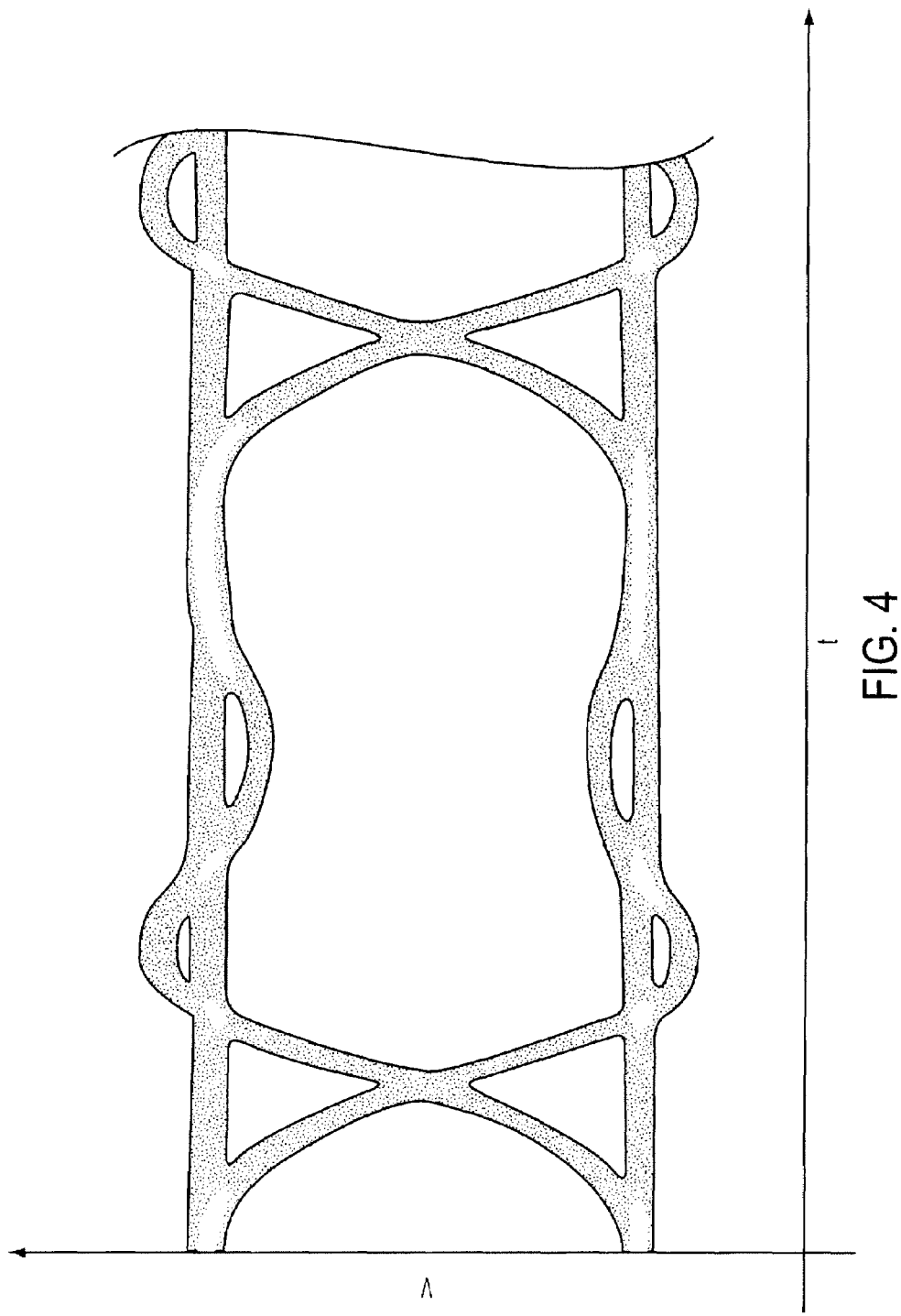
FIG. 4 shows an example wherein multiple of diagrams as in FIG. 3B are depicted for different values of t.

FIG. 4 shows an example wherein multiple diagrams as in FIG. 3B are depicted for different values of t, with the number of occurrences being represented by a gray scaling (here: from light gray to black with light gray representing the highest and black the lowest number of occurrences, background color is white representing areas where no occurrences are detected) applied for respective value ranges. FIG. 4 thus represents the number of occurrences of the example curve of FIG. 2. This representation substantially corresponds to representations available by use of an oscilloscope.

As can be seen e.g. in FIG. 3A, the ABER value in the middle of the eye is not always constant. This behaviour can also be seen by repeating a measurement at the same sampling point. This is due to variations of the ratio of ones and zeroes in the test signal from one test interval to another test interval. To obtain an eye diagram like in FIG. 4, which shows no occurrences in the middle of the eye, sampling points with a low probability of low number of occurrences can be forced to zero. This has been done for the example of FIG. 4.

Figure 5:
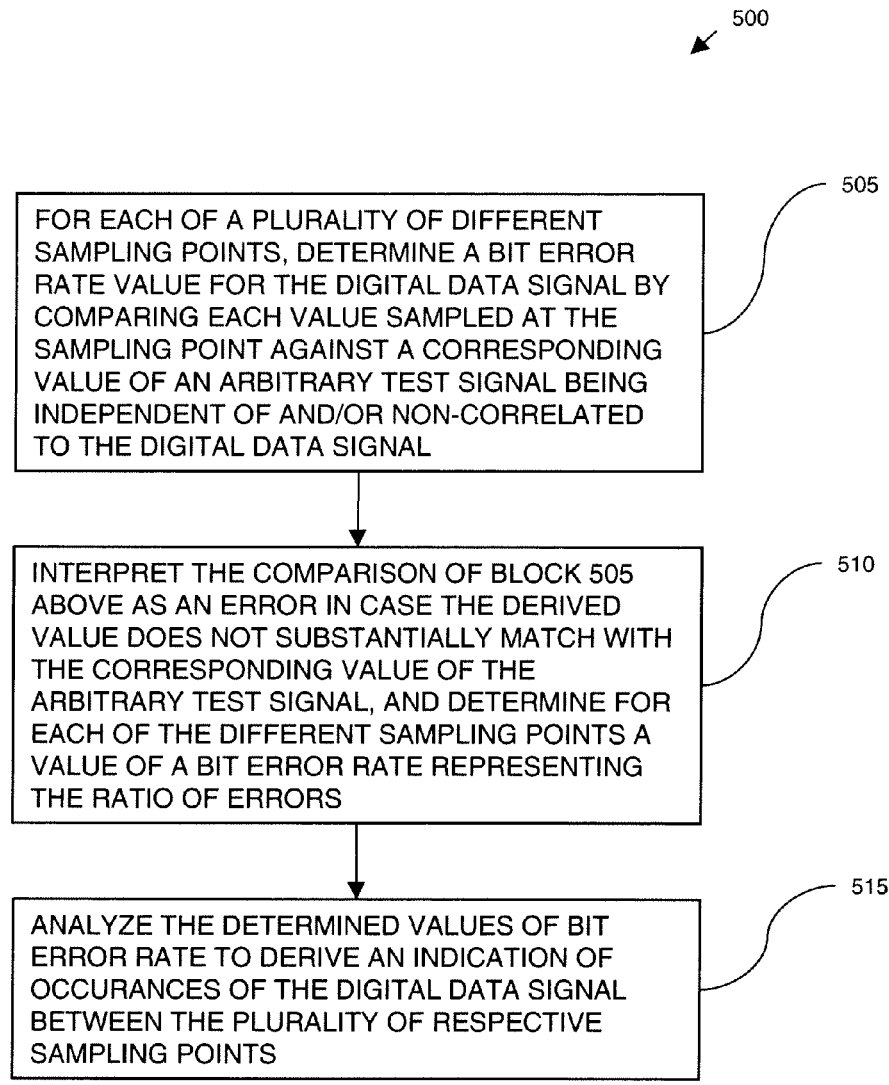
FIG. 5 shows an exemplary method according to the disclosed embodiments.

Referring to FIG. 5, a method 500 for testing a digital data signal, includes the step of determining, for each of a plurality of different sampling points, a value of bit error rate for the digital data signal by comparing each value sampled at the sampling point against a corresponding value of an arbitrary test signal being independent of and/or non-correlated to the digital data signal, as shown in block 505. The method also includes interpreting the comparison of the previous step as an error in case the derived value does not substantially match with the corresponding value of the arbitrary test signal and determining for each of the different sampling points a value of a bit error rate representing the ratio of errors, as shown in block 510. Furthermore, the method also includes analyzing the determined values of bit error rate in order to derive an indication of occurrences of the digital data signal between the plurality of respective sampling points, as shown in block 515.

The invention claimed is:

1. A method for testing a digital data signal, comprising the step of:
    a) determining, for each of a plurality of different sampling points, a value of bit error rate for the digital data signal by comparing each value sampled at the sampling point against a corresponding value of an arbitrary test signal being independent of and/or non-correlated to the digital data signal,
    b) interpreting the comparison of the previous step as an error in case the derived value does not substantially match with the corresponding value of the arbitrary test signal and determining for each of the different sampling points a value of a bit error rate representing the ratio of errors, and
    c) analyzing the determined values of bit error rate in order to derive an indication of occurrences of the digital data signal between the plurality of respective sampling points.

2. The method of claim 1, wherein step b) comprises the step of counting in a sequence of the digital data signal at least one of the following:
    the number of bits in the sequence,
    the number of errors detected according to step b) in the sequence,
    the number of error-free bits in the sequence as the bits where no error is detected according to step c).

3. The method of claim 1, wherein deriving the indication comprises the step of:
    differentiating a course of the determined values of bit error rate over one property of the respective sampling points.

4. The method of claim 1, wherein the indication is at least one of:
    the number of occurrences, a distribution of occurrences, a probability of occurrences.

5. The method of claim 1, further comprising the step of:
    graphically representing of derived indications of occurrences for different sampling points.

6. The method of claim 5, wherein the step of graphically representing comprises at least one of the steps of:
    graphically representing an absolute or relative distribution of derived indications relative to the respective sampling points,
    graphically representing of derived indications in an eye diagram,
    graphically representing an absolute or relative distribution of derived indications relative to the respective threshold values and the respective timing points,
    graphically representing an absolute or relative distribution of derived indications relative to the respective voltages of signal level and the respective timing points.

7. The method of claim 1, wherein steps a) to b) are repeated for a plurality of different relative sampling points, wherein each relative sampling point represents a timing point relative to a period corresponding to the digital data signal.

8. The method of claim 1, wherein step a) comprises a step of:
    deriving the value from the digital data signal at the sampling point.

9. The method of claim 1, wherein in step a) the value is derived by sampling the value of the digital data signal at the sampling point by digitally sampling.

10. The method of claim 1, wherein in step a) the value is derived by:
    comparing the digital data signal with a threshold value of the sampling point and correspondingly providing a comparator output signal,
    sampling the value of the comparator output signal at a timing point of the sampling point as the value derived from the digital data signal at the sampling point.

11. The method of claim 10, wherein the step of comparing comprises at least one of the following:
    comparing the digital data signal directly against the threshold value,
    comparing a normal signal of the digital data signal against a complementary signal of the digital data signal, with the complementary signal being complementary to the normal signal.

12. The method of claim 1, comprising at least one of the features:
    the threshold value is related with respect to a voltage level of the digital data signal,
    the threshold value is related with respect to a difference signal as the difference between a normal signal of the digital data signal and a complementary signal of the digital data signal, with the complementary signal being complementary to the normal signal.

13. The method of claim 1, comprising at least one of the features:

- the timing point is related to a period corresponding to the digital data signal,
- the timing point is related to a current value of the period present at the time of testing the digital data signal,
- the timing point is related to a fixed value of a period,
- the timing point is related to a fixed value of a period substantially corresponding to the period of testing the digital data signal,
- the timing point is related to a current value of the period, which is varying, with a variation of the period of the digital data signal.

14. The method of claim 1, wherein the arbitrary test signal is at least one of:

- a fixed logic value, preferably one of a logic HIGH and a logic LOW signal,
- a pseudo random binary sequence PRBS,
- a signal of alternating logic values, preferably alternating between a logic HIGH and a logic LOW signal.

15. The method of claim 1, wherein the digital data signal is a signal of alternating logic values, and the step c) is executed individually for each value of the alternating logic values.

16. The method of claim 1, wherein each sampling point is represented by a least one of the properties of:

- a threshold value, and
- a timing point in the digital data signal.

17. A system for testing a digital data signal, comprising:

a bit error rate unit for:

- determining, for each of a plurality of different sampling points, a value of bit error rate for the digital data signal by comparing each value sampled at the sampling point against a corresponding value of an arbitrary test signal being independent of and/or non-correlated to the digital data signal,
- interpreting a comparison as an error in case the derived value does not substantially match with the corresponding value of the arbitrary test signal and determining for each of the different sampling points a value of a bit error rate representing the ratio of errors, and
- analyzing the determined values of bit error rate in order to derive an indication of occurrences of the digital data signal between the plurality of respective sampling points.

* * * * *